United States Patent
Kim et al.

(10) Patent No.: US 10,362,675 B2
(45) Date of Patent: Jul. 23, 2019

(54) FLEXIBLE CIRCUIT BOARD HAVING THREE-LAYER DIELECTRIC BODY AND FOUR-LAYER GROUND LAYER STRUCTURE

(71) Applicant: GigaLane Co., Ltd., Hwaseong-si (KR)

(72) Inventors: Sang Pil Kim, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GIGALANE CO., LTD., Hwaseong-si (KR)

( * ) Notice: Subject to any disclaimer, the term of this patent is extended or adjusted under 35 U.S.C. 154(b) by 0 days.

(21) Appl. No.: 15/923,048

(22) Filed: Mar. 16, 2018

(65) Prior Publication Data
US 2018/0206332 A1    Jul. 19, 2018

Related U.S. Application Data

(63) Continuation of application No. PCT/KR2016/010673, filed on Sep. 23, 2016.

(30) Foreign Application Priority Data

Sep. 24, 2015   (KR) .......................... 10-2015-0135435

(51) Int. Cl.
*H05K 1/11* (2006.01)
*H05K 1/02* (2006.01)
(Continued)

(52) U.S. Cl.
CPC ............. *H05K 1/115* (2013.01); *H05K 1/028* (2013.01); *H05K 1/0225* (2013.01);
(Continued)

(58) Field of Classification Search
CPC .. H01L 27/3276; H05K 1/0393; H05K 1/113; H05K 1/114; H05K 1/115; H05K 1/116
See application file for complete search history.

(56) References Cited

U.S. PATENT DOCUMENTS 5,262,594 A    11/1993  Edwin et al.
6,523,252 B1 *  2/2003  Lipponen ................. H01P 3/06
                                                         174/251
(Continued)

FOREIGN PATENT DOCUMENTS

KR    10-0958268       5/2010
KR    10-1065279       9/2011
KR    10-2013-0103347  9/2013

OTHER PUBLICATIONS

KIPO, Written Opinion of Application No. PCT/KR2016/010673, dated Dec. 20, 2016.

*Primary Examiner* — Jeremy C Norris
(74) *Attorney, Agent, or Firm* — Brundidge & Stanger, P.C.

(57) ABSTRACT

Disclosed is a flexible circuit board having a three-layer dielectric body and four-layer ground layer structure. A flexible circuit board having a three-layer dielectric body and four-layer ground layer structure, according to the present invention, comprises: a first dielectric body; a second dielectric body facing the flat surface of the first dielectric body; a third dielectric body facing the bottom side of the first dielectric body; a signal line formed on the flat surface of the first dielectric body; a pair of first ground layers laminated on the flat surface of the first dielectric body and having the signal line therebetween; second ground layers laminated on the bottom side of the first dielectric body so as to correspond to the first ground layers; a third ground layer laminated on the flat surface of the
(Continued)

second dielectric body; and a fourth ground layer laminated on the bottom side of the third dielectric body.

11 Claims, 6 Drawing Sheets

(51) Int. Cl.
*H05K 3/00* (2006.01)
*H05K 1/03* (2006.01)
*H05K 3/46* (2006.01)

(52) U.S. Cl.
CPC ......... *H05K 1/0393* (2013.01); *H05K 3/0044* (2013.01); *H05K 3/4694* (2013.01); *H05K 3/4697* (2013.01); *H05K 2201/093* (2013.01); *H05K 2201/09236* (2013.01); *H05K 2201/09327* (2013.01)

(56) References Cited

U.S. PATENT DOCUMENTS

| | | | |
|---|---|---|---|
| 6,535,088 B1* | 3/2003 | Sherman | H01P 3/087 333/238 |
| 2001/0010271 A1* | 8/2001 | Lin | H05K 1/0224 174/255 |
| 2014/0102763 A1 | 4/2014 | Lin | |
| 2014/0376199 A1* | 12/2014 | Kato | H01P 3/085 361/753 |

* cited by examiner

FLEXIBLE CIRCUIT BOARD HAVING THREE-LAYER DIELECTRIC BODY AND FOUR-LAYER GROUND LAYER STRUCTURE

CROSS-REFERENCES TO RELATED APPLICATION

This application is a Continuation application of PCT Patent Application No. application of PCT/KR2016/010673 filed on Sep. 23, 2016, which claims priority to Korean Patent Application No. 10-2015-0135435 filed on Sep. 24, 2015, the contents of which are incorporated herein by reference.

TECHNICAL FIELD

The invention related to a flexible circuit board having three-layer dielectric and four-layer ground layer structure.

BACKGROUND

Wireless terminal such as cellular phone comprises RF (Radio Frequency) signal line. The RF signal line is normally made of coaxial cable. Such RF signal line made of coaxial cable makes the inner space of the wireless terminal narrower so that flexible circuit board generally applied to the wireless terminal nowadays.

Normally, a flexible circuit board reduces line loss and reduces reflection loss of a signal, thereby securing a necessary signal condition. Reducing the line loss is possible by increasing the area of the signal line or by increasing the thickness of the signal line. The reduction of the reflection loss is also possible by shielding an external signal from the outside.

Flexible circuit board has optimum impedance of about 33Ω at the signal transmitter, and optimum impedance of about 75Ω at the signal receiver. Considering both the transmitter and receiver, it is ordinary that flexible circuit board should be designed to have characteristic impedance of about 50Ω.

In the case that external environmental signals are introduced from other outside components, the characteristic impedance would be deviated from the normal level of 50Ω, so that the signal transmission efficiency might be aggravated.

Therefore, flexible circuit board should be applied at the reasonably separated location from other components so as to prevent unwanted impedance variation. In this case, however, the inner space of the terminal, which is the main merit and advantage of flexible circuit board, may be narrower.

Flexible circuit board may be placed near other components by the impedance matching. But, in this case, the shape of flexible circuit board should be changed as well, according to the variation of shape or location of at least one component among its main board, sub board, battery or so. Therefore, it is necessary that the flexible circuit board can be installed freely inside of the wireless terminal without effect of other components thereof.

The background described herein will be understood only for the purposes of understanding of background of the invention, so that said background should not be accepted the prior art of the invention in the view of the person having ordinary skilled in the art.

PRIOR ART

JP 2012-253342A(2012.12.20)

DETAILED DESCRIPTION OF THE INVENTION

Technical Problems

The invention may provide the flexible circuit board, which can be installed in the terminal without locational limit.

SUMMARY OF THE INVENTION

To achieve above purposes, a flexible circuit board having a three-layer dielectric and a four-layer ground layer structure according to preferable embodiment of the invention may comprise a first dielectric; a second dielectric facing an upper surface of the first dielectric; a third dielectric facing the bottom of the first dielectric; a signal line formed on the first dielectric; a pair of first ground layers stacked on the first dielectric with the signal line therebetween; a second ground layer stacked on the bottom surface of the first dielectric corresponding to the first ground layer; a third ground layer stacked on the second dielectric; and a fourth ground layer stacked on the bottom surface of the third dielectric.

In addition, a plurality of ground holes may be formed in the third ground layer at regular and predetermined distances in the longitudinal direction of the signal line, and the fourth ground layer may be surface-bonded to the third dielectric in a shape corresponding to the third dielectric.

The third dielectric may be thicker than the second dielectric, as well.

The first ground layer and the second dielectric may be bonded via a first bonding sheet, and the second ground layer and the third dielectric may be bonded via a second bonding sheet.

The first bonding sheet is provided in a pair with a signal line therebetween, and the first bonding sheet is interposed between a pair of the first ground layers and the second dielectric, so that an inner space may be defined by the second dielectric, the first bonding sheet, the first ground layer and the first dielectric.

In addition, the flexible circuit board having the three-layer dielectric and the four-layer ground layer structure includes a first substrate part, a second substrate part and a third substrate part. The first substrate part may comprise the first dielectric, the second dielectric, the third dielectric, the signal line, the first ground layer, the second ground layer, the third ground layer, and the fourth ground layer. The second substrate part may comprise the second dielectric, the signal line, the first ground layer, the first dielectric, the second ground layer, and the third dielectric, extended from the first substrate part respectively. The third substrate part may comprise the first ground layer, the signal line, the first dielectric, and the second ground layer, extended from the first substrate part respectively.

The signal line may include a first signal line and a pair of second signal lines branched from the first signal line and positioned in parallel with each other.

The flexible circuit board having the three-layer dielectric and the four-layer ground layer structure includes the first substrate part, the second substrate part and the third substrate part. The first substrate part may comprise the first dielectric, the second dielectric, the third dielectric, the signal line, the first ground layer, the second ground layer, the third ground layer, and the fourth ground layer. The second substrate part may include the second dielectric, the signal line, the first ground layer, the first dielectric, the second ground layer, and the third dielectric. Also, the third substrate part may comprise the signal line, the first dielectric, and the second ground layer, wherein the signal line is connected to the first signal line and the first signal line, extended from the first substrate part respectively. Meanwhile, the signal line may include a first signal line and a pair of second signal lines that are branched and located in parallel with each other.

In addition, the flexible circuit board having the three-layer dielectric and the four-layer ground layer structure may comprise a first substrate part including formed of the first dielectric, the second dielectric, the third dielectric, the signal line, the first ground layer, the second ground layer, the third ground layer, and the fourth ground layer; the second substrate part including the signal line, the first ground layer, the first dielectric, the second ground layer, and the third dielectric, extending from the first substrate part respectively; and a third substrate part including the signal line, the first dielectric, and the first ground layer, extending from the second substrate part respectively; wherein the signal line may include a first signal line and a pair of second signal lines branching from the first signal line and positioned in parallel with each other.

The gap between the second signal line and the first ground layer may be smaller than the gap between the first signal line and the first ground layer.

The details of embodiments of the invention are set forth in the accompanying drawings and the description below.

The terms and words used in this specifications and claims should not be interpreted by the means of ordinary, plane and dictionary meaning, instead that the terms and words therein should be interpreted according to the technical idea of the invention, by the principle of lexicographer.

The Effects of the Invention

The invention may have various effects as bellows;

Firstly, flexible circuit board may be placed anywhere inside the wireless terminal.

Secondly, the flexible circuit board may be much more bending durable.

Thirdly, the damages of signal line and ground may be prevented in the course of manufacturing.

DETAILED DESCRIPTION

Figure 1:
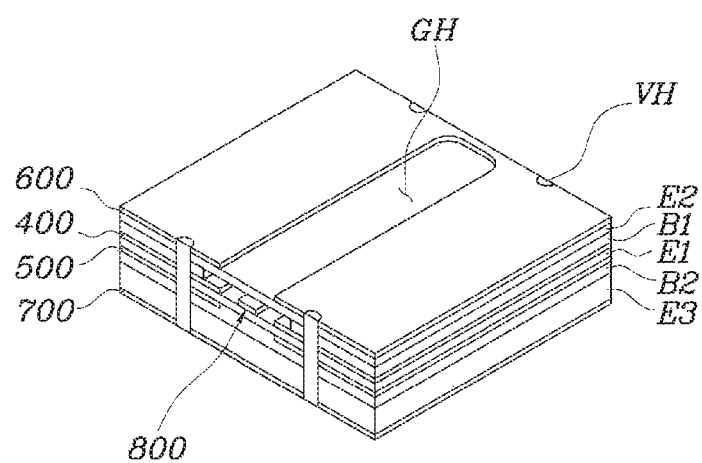
FIG. 1 is a perspective view of an embodiment of a flexible circuit board having a three-layer dielectric and a four-layer ground layer structure according to the invention.

The objects, specific advantages and novel features of the invention will become more apparent from the following detailed description and embodiments accompanying drawings. It should be noted that the reference numerals are added to the elements of the drawings in the specifications with the same numerals as possible, even if they are on other drawings. Also, the terms "first", "second", etc. may be used to describe various elements, but the elements should not be limited by the terms. The terms are used only for the purpose of distinguishing one element from another. In the following description of the invention, a detailed description of publicly-known related arts will be omitted when it is determined that the spirit or gist of the invention may be unnecessarily obscured.

Hereinafter, the embodiments of the invention, the manufacturing method of enhanced bending durable flexible circuit board, will be described in detail with reference to the accompanying drawings.

The flexible circuit board having the three-layer dielectric and the four-layer ground layer structure of the invention can prevent the impedance from being changed due to the influence of other components such as a main board, a sub-board and a battery, and prevent the transmission line from being damaged at the repeatedly bent.

Figure 2:
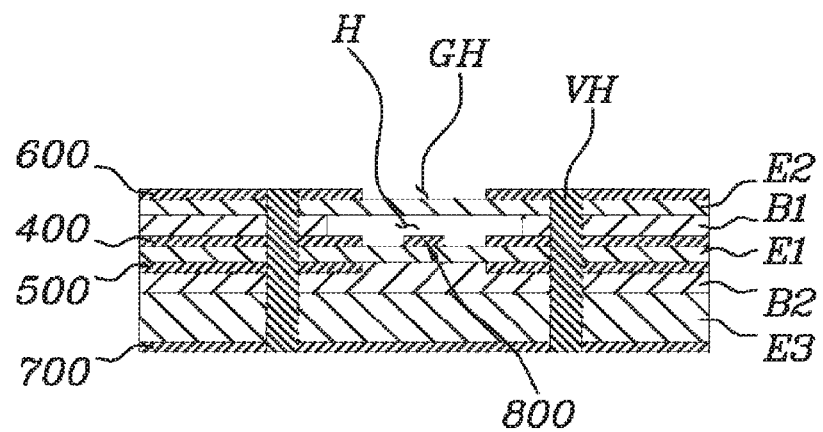
FIG. 2 is a cross-sectional view of one embodiment of a flexible circuit board having a three-layer dielectric and a four-layer ground layer structure of the invention.

As shown in FIGS. 1 and 2, a flexible circuit board having a three-layer dielectric and a four-layer ground layer structure according to the invention includes a first dielectric E1, a second dielectric E2, a third dielectric E3, a first ground layer 400, a second ground layer 500, a third ground layer 600, a fourth ground layer 700, a via hole VH, and a signal line 800.

The three-layer dielectric structure comprises the first dielectric E1, the second dielectric E2 that is facing and spaces apart from the upper surface of the first dielectric by a predetermined distance, and a third dielectric E3 parallel to the first dielectric E1 and facing and spaced apart from the bottom of the first dielectric E1 by a predetermined distance.

The four-layer ground layer structure comprises a first ground layer 400 stacked on the surface of the first dielectric E1, a second ground layer 500 stacked on the bottom surface of the first dielectric E1, a third ground layer 600 stacked on the surface of the second dielectric, and a fourth ground layer 700 stacked on the bottom surface of the third dielectric E3.

The first ground layer 400 and the bottom surface of the second dielectric E2 are bonded to each other through the first bonding sheet B1, while the second ground layer 500 and the upper surface of the third dielectric E3 are bonded by a second bonding sheet B2.

Also, the flexible circuit board having three-layer dielectric and a four-layer ground layer structure according to an embodiment of the invention may include a via hole VH filled with a conductor material. A via hole VH filled with a conductor in a hole passing through the first E1 to the third dielectric E3, and the first ground layer 400 to the fourth ground layer 700, and the first bonding sheet B1 and the second bonding sheet B2, in order to enable to be conductive and connected electrically.

A signal line 800 is disposed on the first dielectric E1, and a pair of the first bonding sheet B1 are spaced apart from each other with the signal line 800 therebetween, so that the inner space is formed by the second dielectric E2 and the first bonding sheet B1. Accordingly, it is preferable that the signal line 800 is located in the inner space. That is, since the signal line 800 is located in the inner space and exposed to the air having a low dielectric constant (ε=1.0005), the flexible circuit board can reduce the line loss in the signal line 800. As described above, it is preferable that the shape of the first bonding sheet B1 is a square, for example a "☐" shape, in order to prevent outer material from introducing through its both ends.

It is preferable that a plurality of ground holes GH is formed at a regular distance from each other in the third ground layer 600. The gap between the second ground layer 500 and the fourth ground layer 700 is preferably larger than the gap between the first ground layer 400 and the third ground layer 600.

The flexible circuit board according to an embodiment of the invention may prevent an external signal from being introduced using the fourth ground layer 700. Also, it is possible to satisfy the characteristic impedance of the signal line 800 adjusted to about 50Ω by using the fourth ground layer 700 and the third ground layer 600 having the plurality of ground holes GH, as well as to reduce the line loss and thickness thereof.

The gap between the second ground layer 500 and the fourth ground layer 700 and the gap between the first ground layer 400 and the third ground layer 600 may be controlled by adjusting the thickness of the second dielectric E2 and the third dielectric E3. In this case, the thickness of the third dielectric E3 is preferably 1.5 times or more the thickness of the second dielectric E2.

Provided that the thickness of the third dielectric E3 is increased, the signal line 800 can be formed thicker and the line loss can be reduced at transmitting the signals.

In addition, the second dielectric E2 can be made thinner and the thickness of the flexible circuit board can be reduced, by forming the ground hole GH in the third ground layer 600.

Figure 3:
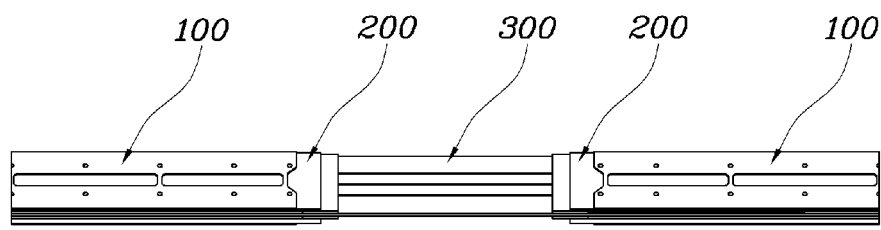
FIG. 3 is a schematic view of another embodiment of a flexible circuit board having a three-layer dielectric and a four-layer ground layer structure of the invention.
Figure 4:
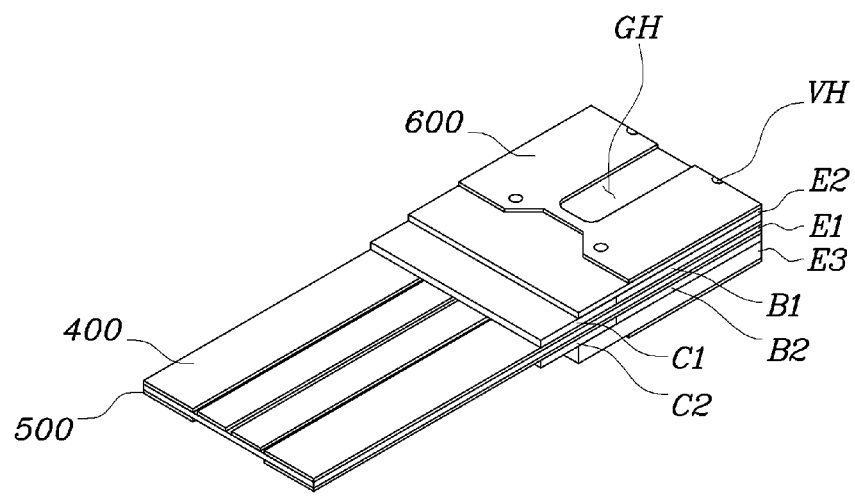
FIG. 4 is a diagram showing another embodiment of a flexible circuit board having a three-layer dielectric and a four-layer ground layer structure according to the invention.
Figure 5:
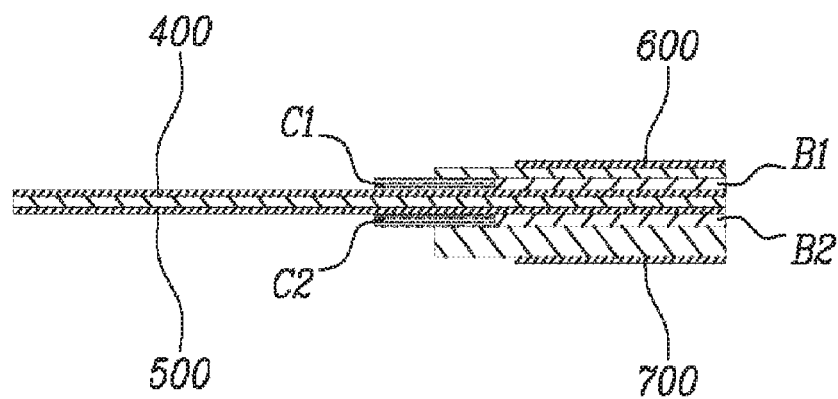
FIG. 5 is a cross-sectional view of another embodiment of a flexible circuit board having a three-layer dielectric and a four-layer ground layer structure of the invention.

As shown FIGS. 3 to 5, the flexible circuit board having the three-layer dielectric and the four-layer ground layer structure of the invention may include a first substrate part 100, a second substrate part 200, and a third substrate part 300.

The thicknesses of the first substrate part 100, the second substrate part 200, and the third substrate part 300 are sequentially decreased.

The second substrate part 200 is formed to extend from one side of the first substrate part 100 to be thinner than the first substrate part 100. The third substrate part 300 is formed on one side of the second substrate part 200 to be thinner than the second substrate part 200, as well.

The third substrate part 300 may be a section where bending occurs repeatedly in the wireless terminal. As the possibility of breakage increases since stress is concentrated on the connection portion between the first substrate part 100 and the third substrate part 300 due to sudden change of thickness between the first substrate part 100 and the third substrate part 300, the inventors have introduced the concept of "sequential thickness variation" of the parts.

The second substrate part 200 according to an embodiment of the invention may exclude at least one of the third ground layer 600 and the fourth ground layer 700.

That is, the second substrate part 200 comprises the first dielectric E1, the second dielectric E2, a third dielectric E3, a first ground layer 400, and a second ground layer 500. The third ground layer 600 and the fourth ground layer 700 are selectively applied or not applied to the first substrate part 100 in order that the second substrate part 200 is made to be thinner than the first substrate part 100.

The third substrate part 300 may be formed thinner than the second substrate part 200 by excluding at least of two selected from the group consisting of the second dielectric E2, the third dielectric E3, the third ground layer 600 and the fourth ground layer 700.

As the first substrate part 100, the second substrate part 200 and the third substrate part 300 are sequentially thinned, it is possible to prevent stress concentration at a specific portion due to a sudden change in thickness, and the flexible circuit board has an advantage that bending durability is highly improved.

The flexible circuit board with three-layer dielectric and a four-layer ground layer structure may comprise a first protective sheet C1 and a second protective sheet C2. The first protective sheet C1 and the second protective sheet C2 are made of a poly-based resin such as polyimide or an epoxy-based resin. The first protective sheet C1 and the second protective sheet C2 are installed between the first dielectric E1 and the second dielectric E2, the first dielectric E1 and third dielectric E3 respectively, and are connected to or overlap with the first bonding sheet (B1) and the second bonding sheet (B2) respectively.

The third substrate part 300 may be made by cutting, with blade or laser beam or the like, the second dielectric E2 on the upper surface of the first dielectric E1 and a third dielectric E3 on the bottom surface of the first dielectric E1. In this case, the first protective sheet C1 is introduced between the second dielectric E2 and the first ground layer 400 so as to be connected or overlapped at one end of the first bonding sheet B1, and the other end is formed so as to protrude further than the end of the second dielectric E2 in the direction of the signal line.

The second protective sheet C2 is interposed between the third dielectric E3 and the second ground layer 500 such that the second protective sheet C2 is connected to one end of the second bonding sheet B2 or at least partially overlaps the second protective sheet C2. The other end of the second protective sheet C2 is formed so as to protrude further in the signal line direction than one end of the third dielectric E3. Here, the second ground layer 500 may correspond to the first ground layer 400 around the first dielectric E1. Therefore, the first ground layer 400 and the second ground layer 500 are prevented from being damaged, and unnecessary carbide formation is prevented during cutting, since the protective sheets C1 and C2 protect the signal line 800, the first ground layer 400, and the second ground layer 500 from the blade, laser, or the like used for cutting.

The first protective sheet C1 is coated with a thermosetting adhesive on its bottom surface so as to be fixed between the second dielectric E2 and the first ground layer 400. The thermosetting adhesive can be applied only to the surface except the surface exposed to the outside by cutting the second dielectric E2. In addition, the first bonding sheet B1 may be extended on the upper surface of the first protective sheet C1 so that at least a part thereof overlaps with the first protective sheet C1 without applying a thermosetting adhesive.

The second protective sheet C2 may be coated with a thermosetting adhesive on its upper surface so as to be fixed between the third dielectric E3 and the second ground layer 500, and the coating with the adhesive applied except the surface exposed to the outside thereof by cutting the third dielectric E3. Also, the second protective sheet C2 may be formed so that the second bonding sheet B2 is extended and overlapped with the second protective sheet C2 without applying the thermosetting adhesive.

Meanwhile, a pair of the first bonding sheet B1 may form an inner space to be defined by installing spaced apart from each other by a regular distance between a pair of the signal lines 800, and the inner space is made by the first dielectric sheet E1, the second dielectric sheet E2, and the first bonding sheet B1. Thereby the first bonding sheet B1 is provided with an inner space forming groove H.

Hereinafter, various embodiments of the third substrate part will be described.

Figure 6:
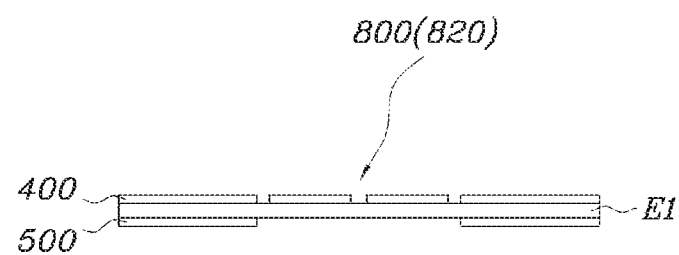
FIG. 6 is a view showing a first embodiment of a third substrate part having a three-layer dielectric and a four-layer ground layer structure of the invention.

FIG. 6 is a view showing a first embodiment of the third substrate part 300 which is an essential part of the invention.

As shown in FIG. 6, the third substrate part 300 may include the first dielectric E1, the signal line 800 stacked on the upper surface of the first dielectric E1, and a pair of the first ground layers 400 stacked on the first dielectric E1 and spaced apart from each other by a regular distance between the signal lines, a pair of the second ground layers 500 stacked on the bottom surface of the first dielectric E1 and spaced apart from each other by a regular distance. In this case, the signal lines 800 may include a first signal line 810 and a pair of parallel second signal lines 820 branched from the first signal line 810.

Figure 7:
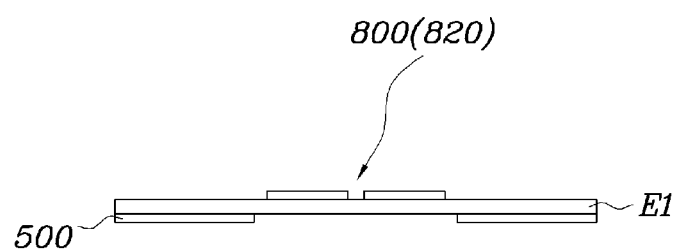
FIG. 7 is a view showing a second embodiment of a third substrate part having a three-layer dielectric and a four-layer ground layer structure of the invention.

FIG. 7 is a view showing a second embodiment of the third substrate part 300 of the invention.

As shown in FIG. 7, the third substrate part 300 may include the first dielectric E1, a signal line 800 stacked on the first dielectric E1, and a pair of second ground layers 400 stacked on bottom surface of the first dielectric E1 and spaced apart from each other by a regular distance. In this case, signal lines 800 may include the first signal line 810 and a pair of parallel second signal lines 820 branched from the first signal line 810.

Figure 8:
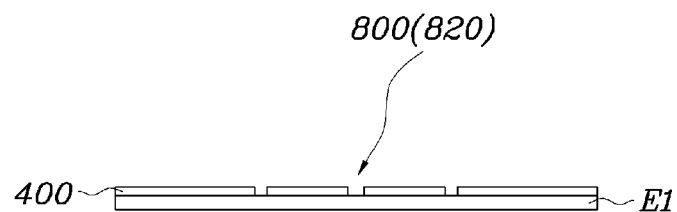
FIG. 8 is a view showing a third embodiment of a third substrate part having a three-layer dielectric and a four-layer ground layer structure of the invention.

FIG. 8 is a view showing a third embodiment of the third substrate part 300 of the invention.

As shown in FIG. 8, the third substrate part 300 may include the first dielectric E1, a signal line 800 stacked on the first dielectric E1, and a pair of first ground layers 400 stacked on the surface of the first dielectric E1 and spaced apart from each other by a regular distance. In this case, signal lines 800 may include a first signal line 810 and a pair of parallel second signal lines 820 branched from the first signal line 810.

Figure 9:
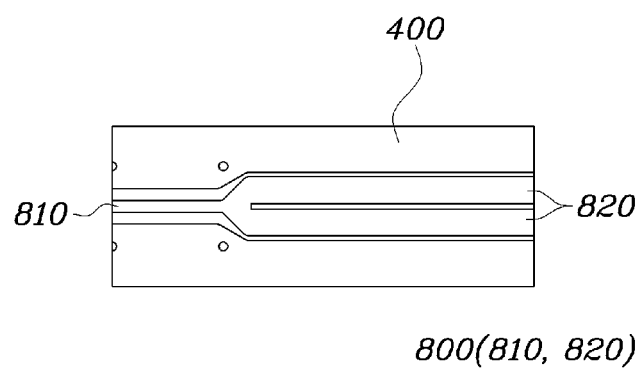
FIG. 9 is a plane view showing the first and third embodiments of a third substrate part having a three-layer dielectric and a four-layer ground layer structure of the invention.

As shown in FIG. 9, in case of the first and third embodiments of the third substrate part 300 of the invention, the gap between the outer side of the second signal line 820 and inner side of the first ground layer may be thinner than one end of the first signal line 810 and inner side of the first ground layer 400.

Figure 10:
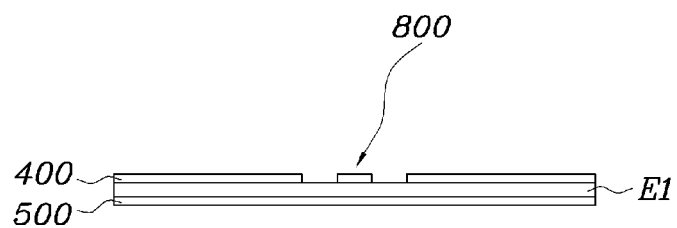
FIG. 10 is a view showing the fourth and fifth embodiments of a third substrate part having a three-layer dielectric and a four-layer ground layer structure of the invention.

FIG. 10 is a view showing a fourth and fifth embodiments of the third substrate part 300 of the invention. In addition, FIG. 11 is a view showing the second ground layer 500 of the third substrate part 300 in the fourth embodiment of the invention.

Figure 11:
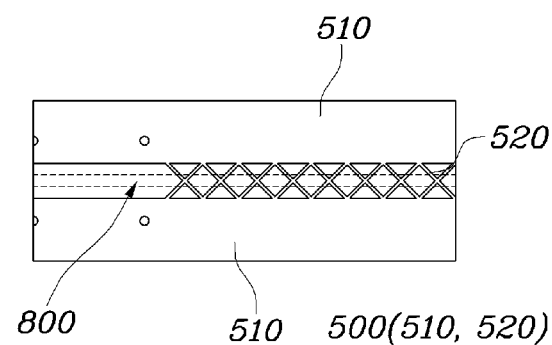
FIG. 11 is a view showing the second ground layer in the third substrate part of the fourth embodiment having a three-layer dielectric and a four-layer ground layer structure of the invention.

As shown in FIG. 10 and FIG. 11, the third substrate part 300 in the fourth embodiment may include the first dielectric E1, a signal line 800 stacked on the surface of the first dielectric E1, a pair of first ground layers 400 stacked on the first dielectric E1 and spaced apart from each other by a regular distance between the signal lines 800, and the second ground layer 500 on the bottom surface of the first dielectric E1. In this case, the second ground layer 500 may include a pair of line grounds 510, which is formed apart from each other on the both side of the signal line 800, and a mesh ground 520 to make a connection with a pair of ground 510.

Meanwhile, in the fifth embodiment of the third substrate part 300 of the invention, the second ground layer 500 is made of silver paste.

While the present invention has been particularly shown and described with reference to exemplary embodiments thereof, it is to be understood that the invention is not limited to the flexible circuit board according to the invention, and it will be apparent to those skilled in the art that variations and modifications may be made without departing from the scope of the present invention.

It will be understood by those skilled in the art that various changes in form and details may be made therein without departing from the spirit and scope of the invention as defined by the attached claims.

What is claimed is:

1. A flexible circuit board including three-layer dielectric and four-layer ground layer structure, the flexible circuit board comprising:
    a first dielectric;
    a second dielectric facing an upper surface of the first dielectric;
    a third dielectric facing a bottom surface of the first dielectric;
    a signal line formed on the upper surface of the first dielectric and spaced apart from the second dielectric, wherein an unfilled gap is provided between the signal line and the second dielectric, and wherein a portion of the second dielectric defines a top of the unfilled gap;
    a pair of first ground layers stacked on the first dielectric with the signal line therebetween;
    a second ground layer stacked on the bottom surface of the first dielectric corresponding to the pair of the first ground layers;
    a third ground layer stacked on the second dielectric; and
    a fourth ground layer stacked on a bottom surface of the third dielectric,
    wherein a plurality of ground holes is formed in the third ground layer at regular and predetermined distances in the longitudinal direction of the signal line, and an exposed portion of the second dielectric is at a bottom end of each of the plurality of ground holes.

2. The flexible circuit board according to claim 1, wherein the fourth ground layer is surface-bonded in a shape corresponding to the third dielectric.

3. The flexible circuit board according to claim 2, wherein the third dielectric is thicker than the second dielectric.

4. The flexible circuit board according to claim 3, wherein the pair of the first ground layers and the second dielectric are bonded via a first bonding sheet, and the second ground layer and the third dielectric are bonded via a second bonding sheet.

5. The flexible circuit board according to claim 4, wherein the first bonding sheet is provided as a pair of first bonding sheets with the signal line therebetween, and the first bonding sheet is interposed between the pair of the first ground layers and the second dielectric to form an inner space defined by the second dielectric, the first bonding sheet, the pair of the first ground layers and the first dielectric.

6. The flexible circuit board according to claim 1, wherein a first substrate part comprises the first dielectric, the second dielectric, the third dielectric, the signal line, the pair of the first ground layers, the second ground layer, the third ground layer, and the fourth ground layer;
wherein a second substrate part comprises the second dielectric, the signal line, the pair of the first ground layers, the first dielectric, the second ground layer, and the third dielectric, extended from the first substrate part respectively; and
wherein a third substrate part comprises the first ground layer, the signal line, the first dielectric, and the second ground layer, extended from the second substrate part respectively.

7. The flexible circuit board according to claim 6, wherein the signal line comprises a first signal line and a pair of second signal lines branched from the first signal line and positioned in parallel with each other.

8. The flexible circuit board according to claim 7, wherein a gap between each of the pair of the second signal lines and each of the pair of the first ground layers is smaller than a gap between the first signal line and each of the pair of the first ground layers.

9. The flexible circuit board according to claim 1, wherein a first substrate part comprises the first dielectric, the second dielectric, the third dielectric, the signal line, the pair of the first ground layers, the second ground layer, the third ground layer, and the fourth ground layer;
wherein a second substrate part comprises the second dielectric, the signal line, the pair of the first ground layers, the first dielectric, the second ground layer, and the third dielectric, extended from the first substrate part respectively;
wherein a third substrate part comprises the signal line, the first dielectric, and the second ground layer, extended from the second substrate part respectively; and
wherein the signal line includes a first signal line and a pair of second signal lines branched from the first signal line and positioned in parallel with each other.

10. The flexible circuit board according to claim 1, wherein a first substrate part comprises the first dielectric, the second dielectric, the third dielectric, the signal line, the pair of the first ground layers, the second ground layer, the third ground layer, and the fourth ground layer;
wherein a second substrate part comprises the second dielectric, the signal line, the pair of the first ground layers, the first dielectric, the second ground layer, and the third dielectric, extended from the first substrate part respectively;
wherein a third substrate part comprises the signal line, the first dielectric, and the pair of the first ground layers, extended from the second substrate part respectively; and
wherein the signal line includes a first signal line and a pair of second signal lines branched from the first signal line and positioned in parallel with each other.

11. The flexible circuit board according to claim 10, wherein a gap between each of the pair of the second signal lines and each of the pair of the first ground layers is smaller than a gap between the first signal line and each of the pair of the first ground layers.

* * * * *